United States Patent
Szlufcik et al.

(10) Patent No.: US 9,246,044 B2
(45) Date of Patent: Jan. 26, 2016

(54) PHOTOVOLTAIC CELLS HAVING METAL WRAP THROUGH AND IMPROVED PASSIVATION

(75) Inventors: Jozef Szlufcik, Wilsele (BE); Christophe Allebe, Orbais (BE); Frederic Dross, Schaarbeek (BE); Guy Beaucarne, Oud-Heverlee (BE)

(73) Assignee: IMEC, Leuven (BE)

( * ) Notice: Subject to any disclaimer, the term of this patent is extended or adjusted under 35 U.S.C. 154(b) by 756 days.

(21) Appl. No.: 12/792,624

(22) Filed: Jun. 2, 2010

(65) Prior Publication Data
US 2011/0005582 A1    Jan. 13, 2011

Related U.S. Application Data

(63) Continuation of application No. PCT/EP2008/066662, filed on Dec. 2, 2008.

(60) Provisional application No. 60/992,298, filed on Dec. 4, 2007.

(30) Foreign Application Priority Data

Dec. 3, 2007 (EP) ..................... 07122152

(51) Int. Cl.
    *H01L 31/04*     (2014.01)
    *H01L 31/18*     (2006.01)
    *H01L 31/0224*   (2006.01)

(52) U.S. Cl.
    CPC ...... *H01L 31/1804* (2013.01); *H01L 31/02245* (2013.01); *H01L 31/0224* (2013.01); *H01L 31/022425* (2013.01); *H01L 31/022441* (2013.01); *Y02E 10/547* (2013.01)

(58) Field of Classification Search
    CPC ................ H01L 31/02245; H01L 31/022441; H01L 31/0224; H01L 31/022425; H01L 31/1804; Y02E 10/547
    USPC ............................................ 136/259; 438/93
    See application file for complete search history.

(56) References Cited

U.S. PATENT DOCUMENTS 3,903,427 A * 9/1975 Pack ........................... 250/208.2
6,384,317 B1 * 5/2002 Kerschaver et al. .......... 136/256

(Continued)

FOREIGN PATENT DOCUMENTS

DE    19650111    6/1998
EP    0528311     2/1993

(Continued)

OTHER PUBLICATIONS

Chen et al., Defect passivation in multicrystalline-Si materials by plasma-enhanced chemical vapor deposition of SiO2/SiN coatings, applied physics letters, 1994.*

(Continued)

*Primary Examiner* — Matthew Martin
(74) *Attorney, Agent, or Firm* — Knobbe, Martens, Olson & Bear LLP

(57) ABSTRACT

A photovoltaic device is disclosed. In one aspect, the device is formed in a semiconductor substrate. It has a radiation receiving front surface and a rear surface. The device may have a first region of one conductivity type, a second region with the opposite conductivity type adjacent to the front surface, and an antireflection layer. The rear surface is covered by a dielectric layer covering also an inside surface of the via. The front surface has current collecting conductive contacts. The rear surface has conductive contacts extending through the dielectric. A conductive path is in the via for photogenerated current from the front surface. By having the dielectric all over, no aligning and masking is needed. The same dielectric serves to insulate, provide thermal protection, and helps in surface and bulk passivation. It also avoids the need for a junction region near the via, hence reducing unwanted recombination currents.

18 Claims, 6 Drawing Sheets

Low quality oxide/SiNx:H stack deposition

Local contact area formation

Front and rear side screen printing

Co-Firing

(56) References Cited

U.S. PATENT DOCUMENTS

| | | | |
|---|---|---|---|
| 6,716,737 B2* | 4/2004 | Plas et al. | 438/612 |
| 2005/0172996 A1* | 8/2005 | Hacke et al. | 136/256 |
| 2006/0060238 A1* | 3/2006 | Hacke et al. | 136/256 |
| 2006/0162766 A1* | 7/2006 | Gee et al. | 136/256 |
| 2007/0186971 A1 | 8/2007 | Lochun et al. | |

FOREIGN PATENT DOCUMENTS

| | | |
|---|---|---|
| WO | WO 89/05521 | 6/1989 |
| WO | WO 98/54763 | 12/1998 |
| WO | WO 2006/097303 | 9/2006 |

OTHER PUBLICATIONS

European Search Report dated Aug. 26, 2008 for EP Application No. 07122152.7.

International Search Report and Written Opinion dated Sep. 28, 2009 for PCT/EP2008/066662.

Clement et al., Processing and Comprehensive Characterization of Screen-Printed MC-SI Metal Wrap Through (MWT) Solar Cells; Presented at the $22^{nd}$ European Photovoltaic Solar Energy Conference and Exhibition; Sep. 3-7, 2007; Milan, Italy.

Dauwe et al., Experimental Evidence of Parasitic Shunting in Silicon Ntiride Rear Surface Passivated Solar Cells; Progress in Photovoltaics: Research and Applications, 10: 271-278; published online Jan. 28, 2002.

Mingirulli et al., Lifetime Studies on Laser Drilled Vias for Application in Emitter-Wrap-Through-Solar Cells; Proceedings of the $22^{nd}$ European Photovoltaic Solar. Energy Conference and Exhibition; Sep. 3-7, 2007; Milan, Italy.

Sinton et al., 27.5-Percent Silicon Concentrator Solar Cells; IEEE Electron Device Letters, vol. EDL-7, No. 10 ; Oct. 1986.

* cited by examiner

PHOTOVOLTAIC CELLS HAVING METAL WRAP THROUGH AND IMPROVED PASSIVATION

CROSS REFERENCE TO RELATED APPLICATIONS

This application is a continuation of PCT Application No. PCT/EP2008/066662, filed Dec. 2, 2008, which claims priority under 35 U.S.C. §119(e) to U.S. provisional patent application 60/992,298 filed on Dec. 4, 2007. Each of the above applications is incorporated herein by reference in its entirety.

BACKGROUND OF THE INVENTION

1. Field of the Invention

The present invention is related to photovoltaic devices such as solar cells. More particularly it relates to metal wrap through solar cells improved by specific passivation scheme, and to a cost effective method of manufacturing the same.

2. Description of the Related Technology

Most solar cells described in the prior art can be subdivided into several categories according to their general structure.

One of these categories is the group of the so called back-contacted solar cells, meaning that both ohmic contacts to the two oppositely doped regions of the solar cells are placed on the back or non-illuminated surface of the solar cell. This concept avoids or reduces shadowing losses caused by the front metal contact grid on standard solar cells.

The most straightforward way to fabricate back contact solar cells is to place the carrier collecting junction between semiconductor regions of opposite doping close to the back surface of the cell ("back-junction" cell). The document "1127.5-Percent Silicon Concentrator Solar Cells" (R. A. Sinton, Y. Kwark, J. Y. Gan, R. M. Swanson, IEEE Electron Device Letters, Vol. ED-7. No. 10, October 1986) describes such a device.

Since the majority of photons are always absorbed close to the front surface of the cell, the generated carriers in these regions have to diffuse through the entire base region of the cell towards the carrier collecting junction close to the back surface. For this concept, high quality material with minority carrier diffusion lengths longer than the cell thickness is needed, which makes this solution not applicable for most solar grade materials which generally have short diffusion lengths. Additionally, a perfect front surface passivation is required for cells having the carrier collecting junction close to the back surface.

The largest group of solar cells has the carrier collecting junction close to its front surface. The current from these solar cells is collected by a metal contact to the doped region on the front surface and by a second contact to the oppositely doped region on the back surface. Although this front grid structure can be optimized relatively easily in order to get high collection efficiencies, the trade off between resistance losses and shading losses necessitates a coverage of the front surface by 6-12% of the total area.

Another group of solar cells combines the two approaches. Such solar cells have both external contacts to the oppositely doped regions on the back surface and the collecting junction close to the front surface. The collected current from the front surface is lead through openings, which extend through the entire wafer, to the back surface. Using this structure, shading losses normally arising from the front metallization grid are greatly reduced.

The document WO 1998/054763 (EP 0 985 233 B1) describes such a structure hereafter called Metal Wrap Through (MWT).

Despite their decreased shadowed area those MWT solar cells are still generally efficiency limited due to excessive shunt like recombination happening in the via and under the rear emitter bus bars (as disclosed e.g. in documents: "Processing and comprehensive characterization of screen-printed MC-Si Metal Wrap Through (MWT) Solar cells", Clement et al., Proceedings of the $22^{nd}$ European Photovoltaic Solar Energy Conference, Milan, Italy (2007), p1400-1402; "Lifetime studies on laser drilled vias for application in Emitter-Wrap-Through-Solar Cells", Mingirulli et al., Proceedings of the $22^{nd}$ European Photovoltaic Solar Energy Conference, Milan, Italy (2007), p 1415-1418).

SUMMARY OF CERTAIN INVENTIVE ASPECTS

Certain inventive aspects relate to photovoltaic cells and a method for producing a photovoltaic cell, which alleviates or avoids some problems of the prior art.

In a first aspect of the present invention, there is provided a photovoltaic device as for instance a solar cell, the photovoltaic device having a semiconductor layer having a front surface for receiving impinging light, e.g. sunlight, and a rear surface opposite to the front surface, a front contact, also called emitter contact, for collecting current on the front surface, a rear bus bar, also called emitter busbar, on the rear of the device, e.g. on a rear surface for extracting front side current, a via through the semiconductor layer, the via having a conductive path for coupling the front contact to the rear bus bar, a dielectric layer on a rear surface of the substrate i.e. on the rear surface of the semiconductor layer, a back contact for the rear surface of the semiconductor layer, extending through the dielectric layer to the semiconductor layer, wherein the dielectric layer also covers an inside surface of the via to insulate the conductive path from the semiconductor layer.

Compared to existing designs having vias, by providing the same dielectric inside the via, rather than having some other specific insulation in the via, it is not necessary to have steps for aligning and masking, to keep the dielectric away from the via. Hence manufacturing can be cheaper or quicker. Furthermore, the dielectric in the via helps reduce the need to have a junction region near the via and on the back surface, so there is less damage from drilling the via present in or next to the junction region. This helps reduce unwanted recombination currents, thus improving efficiency. Thus the dielectric can serve multiple purposes, such as surface and bulk passivation, protection against thermal damage caused by firing, back surface reflecting to improve efficiency, and insulating the metal from the semiconductor in the via.

Rear-contacted solar cells usually experience more bowing than conventional solar cells since there is no bus bar on the front to compensate for the high stress induced by Al paste on the rear. Here, thanks to the dielectric stack, the solar cells produced show much less of the detrimental bowing problem.

Another aspect of the invention provides a method of manufacturing a photovoltaic device having a semiconductor layer having a front surface for receiving impinging light, e.g. sunlight, and a rear surface opposite to the front surface. The method includes forming a via through the semiconductor layer, forming a dielectric layer on a rear surface of the substrate, i.e. on the rear surface of the semiconductor layer, such that the dielectric layer also covers an inside surface of the via. The method further comprises forming a conductive path through the via, for collecting current from the front surface, and insulated from the semiconductor layer by the dielectric layer. The method further comprises forming a rear bus bar on the rear of the device e.g. on the rear surface thereof to couple the conductive path through the via, and a back contact for the rear surface of the semiconductor layer, extending through the dielectric layer to the semiconductor layer.

Particular and preferred aspects of the invention are set out in the accompanying independent and dependent claims. Embodiments of any aspect of the invention can have any additional features, and some such additional features are set out in dependent claims, and some are set out in the examples in the detailed description. Features from the dependent claims may be combined with features of the independent claims and with features of other dependent claims as appropriate and not merely as explicitly set out in the claims.

DETAILED DESCRIPTION OF CERTAIN ILLUSTRATIVE EMBODIMENTS

Figure 1:
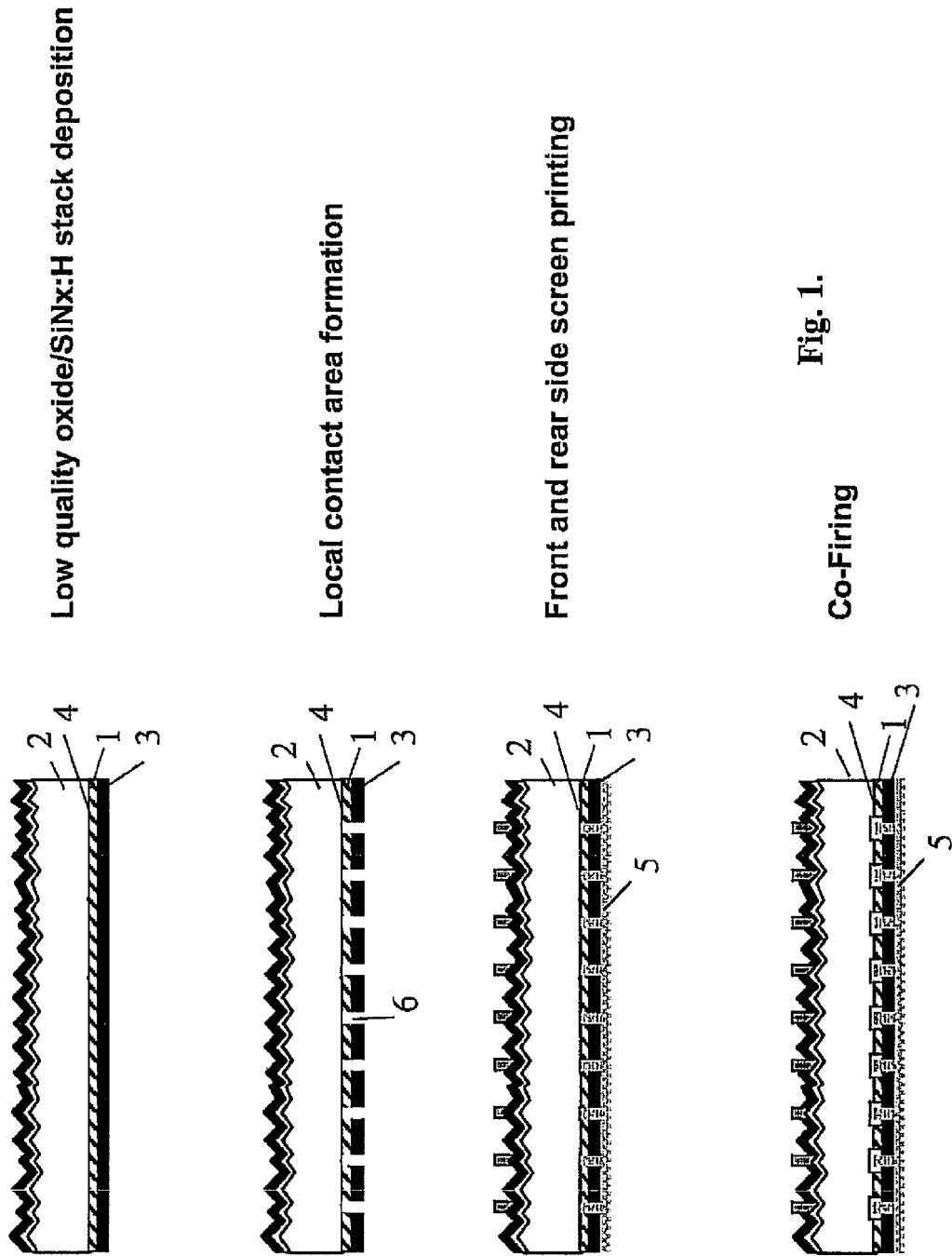
FIG. 1. shows an example of stages in a photovoltaic device, as e.g. a solar cell, fabrication process according to an embodiment of the present invention.

How the present invention can be put into effect will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The embodiments described show a new and improved structure which has some of the features of the known MWT structure mentioned above, and of the so called i-perc structure described in the document WO 2006/097303 A1, which is incorporated herein by reference. The new structure (called i-perc-BC) benefits from the stable passivating stack of the i-perc deposited not only on the rear side but also in the via. An important difference of at least some embodiments compared to the known MWT structure is the absence of diffusion in via and on the rear side. A consequence of this is the reduction or avoidance of defects generated during the via formation being present in the emitter and/or in the depletion region. Such defects cause recombinations which reduces performance. In addition to its beneficial passivating properties, the stack will also serve as a barrier between the metal paste electrically connected to the emitter and covering via and a portion of the rear surface and the underneath bare base region.

In the i-perc structure the stack extends over the whole base region and is only locally opened for contact formation which provides excellent passivation of the surface on the base side. Similarly, in the new structure, the stack provides passivation in the regions covered by base electrode and also in base like regions located in between the emitter and base electrode on the rear side.

From a processing point of view the new structure presents also an advantage compared to the initial MWT structure to be found in a simplification of the solar processing due to absence of need for junction isolation both on the rear and on the front side as a consequence of the absence of emitter regions on the rear side.

Figure 3:
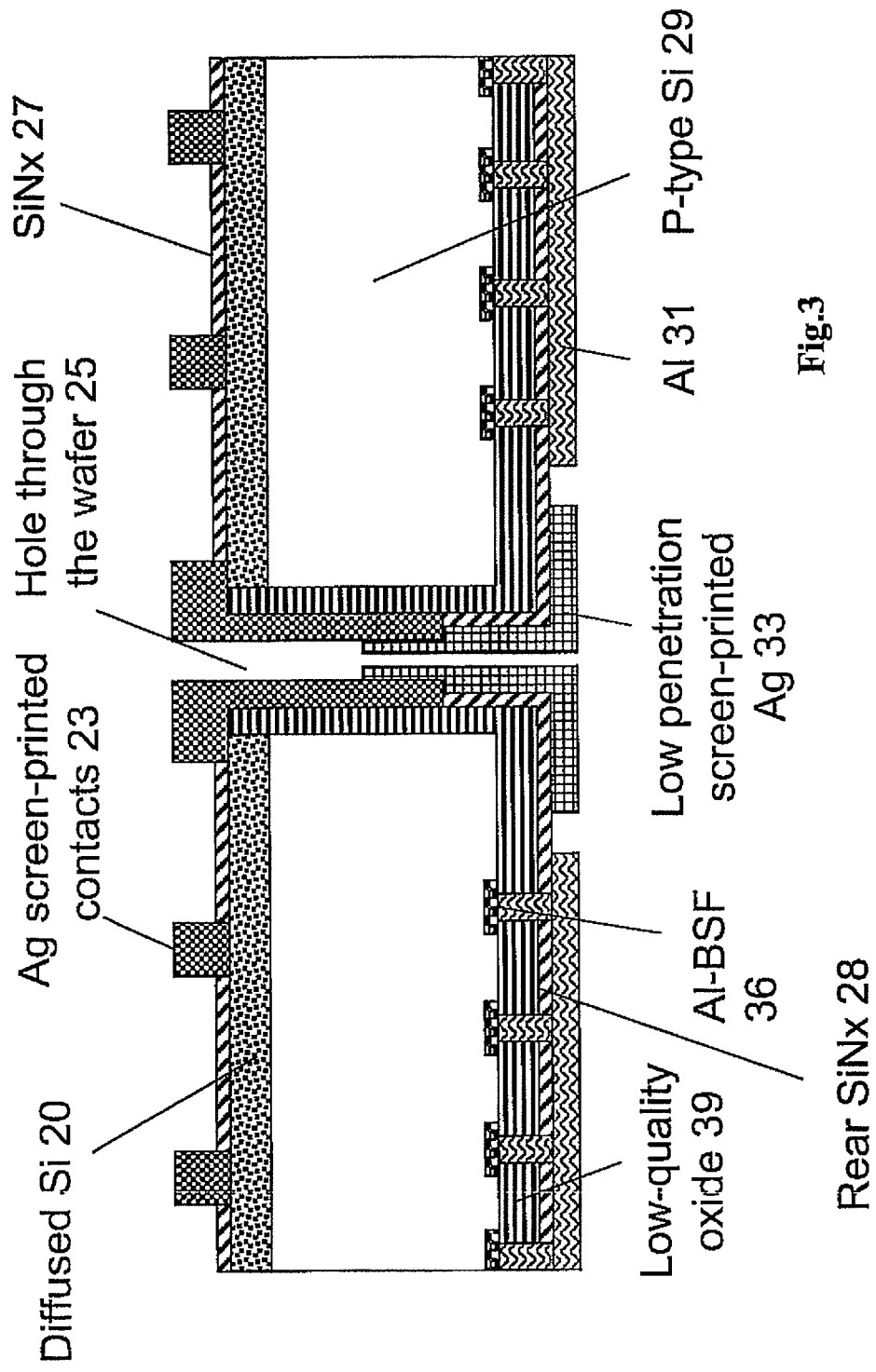
FIG. 3 shows a cross section view of a photovoltaic device according to an embodiment of the invention.

FIGS. 3 to 6, Embodiments of the Invention:

FIG. 3 shows a device according to an embodiment of the present invention. It shows a semiconductor layer in the form of P-type Silicon 29 with a via in the form of a hole 25 through the wafer. The front side has a diffused region 20, covered by a passivation layer 27 of SiNx, with contacts 23, also called emitter contacts, extending through this passivation layer. Not shown are how the contacts would be coupled together to the conductive path in the via to pass the front side current to the bus bars, also called emitter bus bars, at the rear side. On the rear side, an i-perc type structure is shown, in the form of a dielectric stack formed by an oxide layer 39, covered by a SiNx layer 28. This can be implemented using the examples shown in WO2006 097303. Back contacts, also called rear contacts or base contacts, Al-BSF 36 are shown reached by Al (31) extending through holes in the dielectric stack to couple the base contacts together. The dielectric stack extends into the via. The deposited oxide extends all the way through the via, and the SiNx extends at least part way through. The conductive path in the via is printed directly on the oxide or the SiNx, partly from the front side and partly from the rear side. It can also be printed in one step, either from the rear side or from the front side, using specific vacuum conditions to suck the paste in the via if needed.

In other words, this embodiment of a photovoltaic device has a semiconductor substrate, having at least a radiation receiving front surface and a rear surface, the substrate comprising a first region of one conductivity type (29) (e.g., a base region) and a second region with the opposite conductivity type (20) (e.g., an emitter region) adjacent to the front surface, and covered by an antireflection layer (27). The rear surface is covered by a dielectric layer (39) such as a deposited oxide layer or dielectric stack comprising oxide layer and silicon nitride layer (28), the dielectric layer or dielectric stack covering also an inside surface of the via. The front surface has current collecting conductive contacts (23) to the second region (20) and a conductive layer extending into the via (25), the rear surface having current collecting conductive contacts (31) extending through the dielectric to the first region (29) and a rear conductive termination electrode (bus bar) (33). This extends into the via and together with the front conductive layer 23 forms a conductive path for photogenerated current from the front surface to a termination electrode (33) on the rear. By having the dielectric all over, no aligning and masking is needed, and the same dielectric serves to insulate, provide thermal protection for the semiconductor, and helps in surface and bulk passivation. It also avoids the need for a junction region near the via, so reducing damage to the junction region near the via from a manufacturing process of the via and hence reducing unwanted recombination currents.

Figure 4:
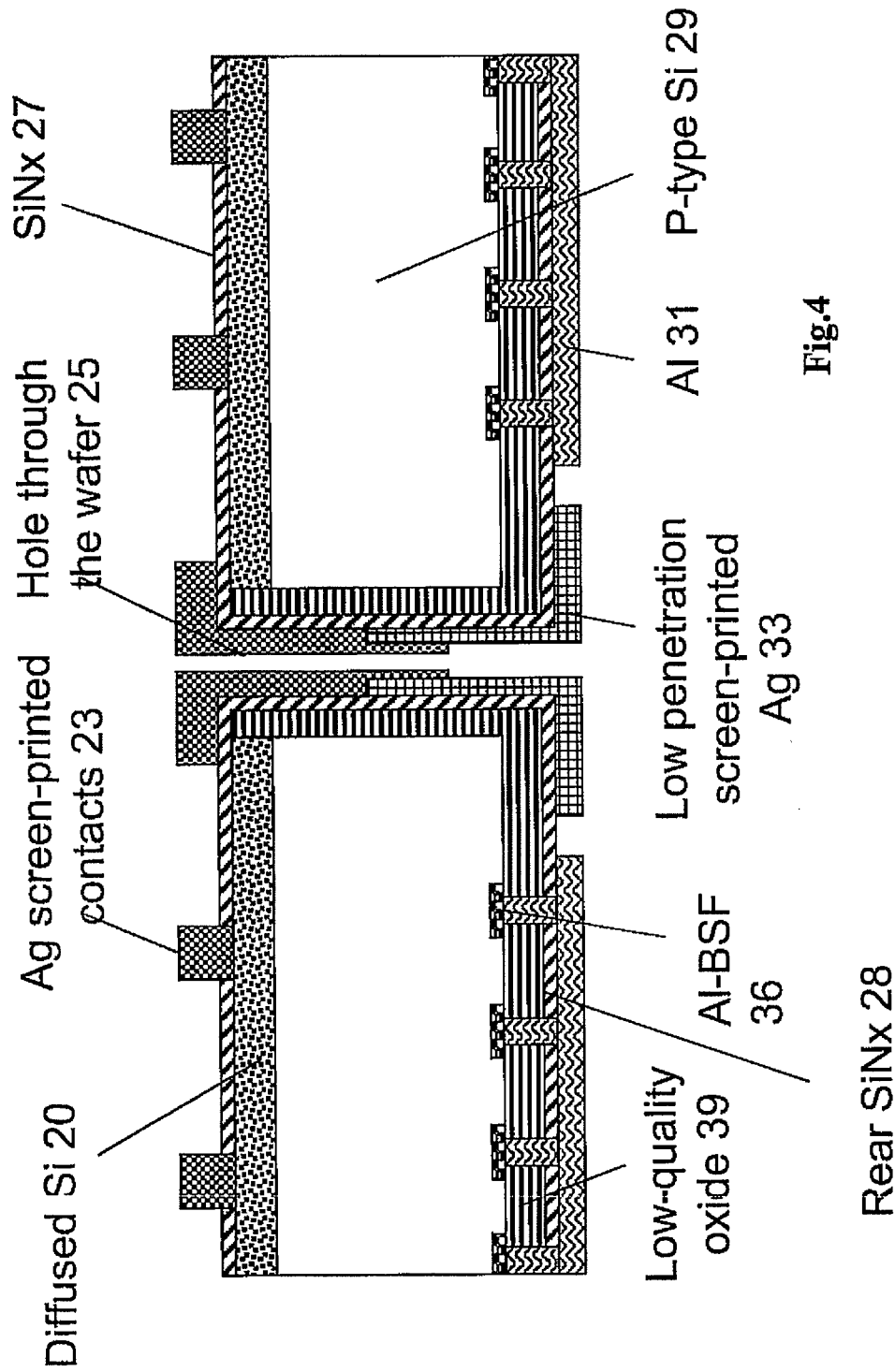
FIG. 4 shows a similar cross section view according to another embodiment.

FIG. 4 shows another embodiment in which corresponding reference numerals are used to those of FIG. 3. Compared to FIG. 3, the SiNx extends in the via all the way through the wafer to the front surface. In some cases it can be deposited all the way through and yet in later manufacturing steps the SiNx can be removed locally in the via near the front surface, to leave an SiNx layer as shown in FIG. 3. This local removal can for example take place by the application of the front metal pastes and the subsequent firing step. The Example shown in FIG. 4 also shows the rear busbar in the form of the screen printed Ag 33 being printed before the front grid is printed (in the form of Ag screen printed contacts 23).

Figure 5:
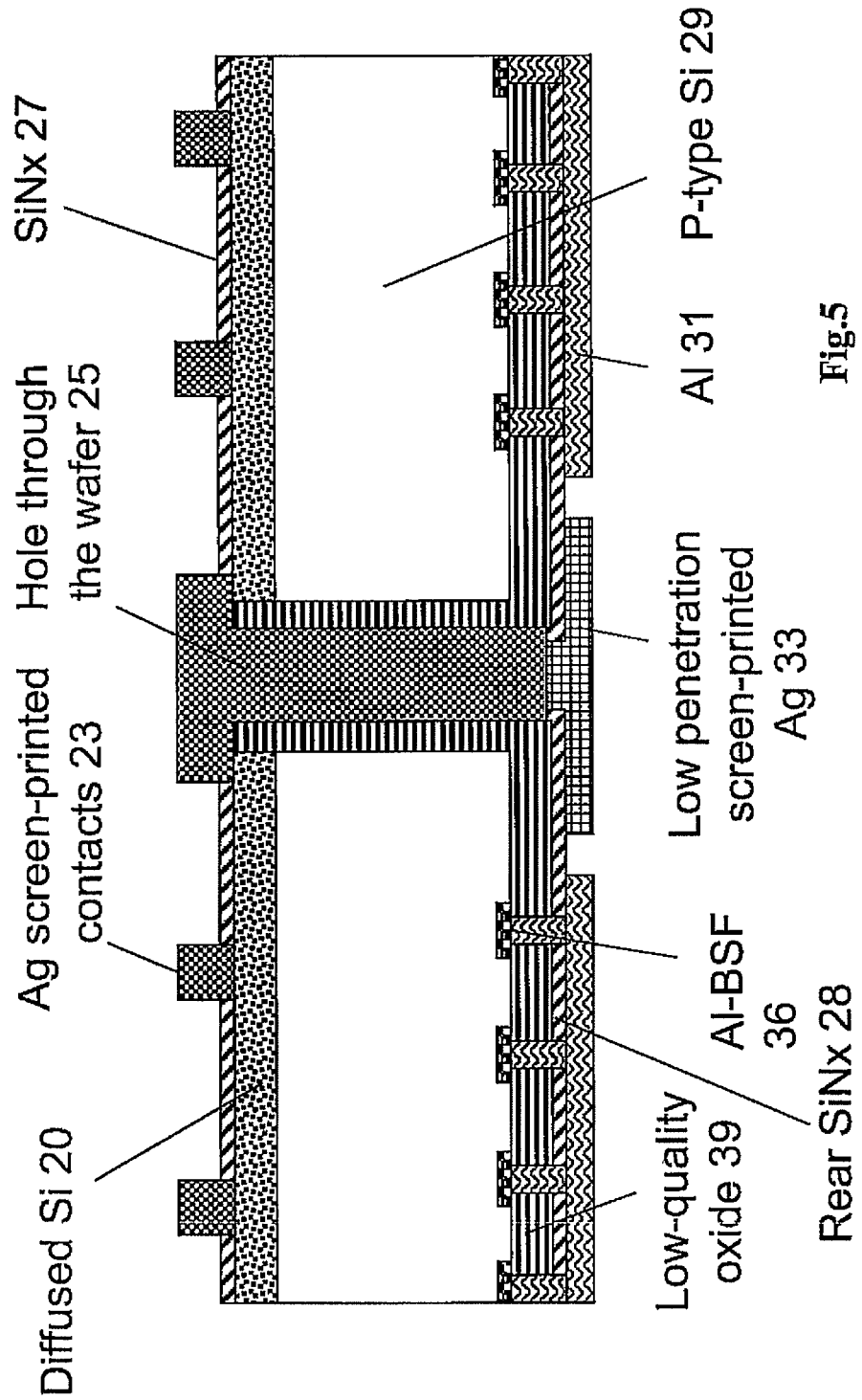
FIG. 5 shows a cross section view of a photovoltaic device according to another embodiment of the invention.

FIG. 5 shows a similar embodiment, with similar reference numerals, but with the SiNx layer on the rear side not extending into the via.

Figure 6:
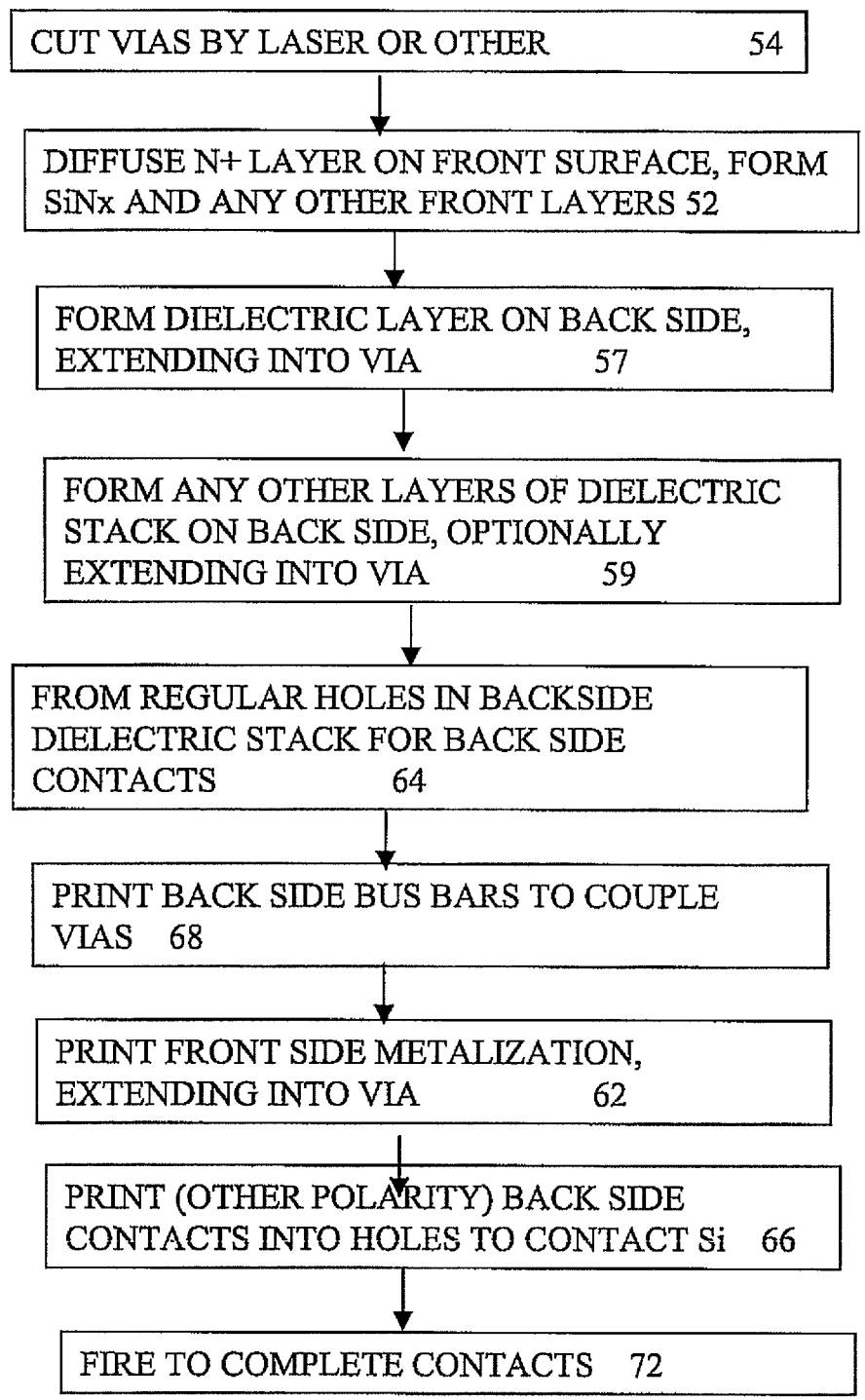
FIG. 6 shows steps in a method of manufacturing according to another embodiment.

FIG. 6 shows method steps according to an embodiment. At block 54 via's are cut through the wafer by means of laser or any other silicon machining or etching method. At block 52, an N+ diffusion layer is created on the front side of the P-type Si. The SiNx and other front side layers if any, are then formed. In principle this block could be carried out before the vias are cut. Either way it is preferable to avoid creating the diffusion layer near the vias so that it does not extend deeper adjacent the vias. At block 57, the dielectric layer is formed all over the back surface without aligning or patterning, so it will extend into the vias. Other layers of the dielectric stack are formed on the dielectric layer, optionally extending into the via at block 59. At block 64, the dielectric stack is locally opened. At blocks 62 and 68, emitter metallization is formed. The emitter busbars are formed on the rear to connect multiple vias together and to collect all the front side current, as shown as block 68. Then the emitter contact grid is formed on the front. They are connected to each other through the via. The emitter electrode extending into the via, and over the dielectric layer is isolated from the base of the semiconductor by the dielectric layer. Forming such conductive paths in the vias can be implemented in various different ways as would be known to those skilled in the art. At block 66, metal is deposited to fill the back-contact holes through the dielectric layer to reach the semiconductor. These accesses to the base of the semiconductor are connected together. At block 72, the device is fired, to do thermal processing of the back and front contacts.

Additional Features

The embodiments described show a semiconductor layer in the form of a silicon substrate, but the invention is not limited thereto. Other suitable substrates can be used as well. The dielectric layer can be implemented by a wide bandgap semiconductor layer acting as a dielectric. There can be many vias closely spaced in a regular pattern so as to minimize losses and minimize the amount of shading by the metal on the front side. A typical spacing might be 2 mm, though other values can be used. The front side contacts can be arranged in star patterns radiating away from each via, or other patterns can be used following known practice. The semiconductor layer can have a diffusion region, formed by diffusion from the front surface and formed so that the diffusion region does not extend deeper into the semiconductor layer in the vicinity of the via. A passivation layer comprising hydrogenated SiN can be provided in the dielectric stack on top of the dielectric layer. The passivation layer can extend into the via.

The busbar of the emitter contact formed on the rear side can be formed after the firing of the front grid and of the rear contact, using for instance a low-temperature paste.

The emitter bus bar can be printed before the front grid so that the material of the bus bar is in direct contact with the dielectric isolating layer. This material provides an additional protection against penetration of the paste used for the front grid, which can be more aggressive because it needs to penetrate during firing through the SiNx deposited as ARC layer on the front. The rear SiN layer or SiN:H layer can have a thickness larger than about 100 nm, preferably larger than about 120 nm, still more preferred larger than about 150 nm, larger than about 180 nm or larger than about 200 nm.

In case of bifacial solar cells, both the front main surface and the rear surface are adapted to receive impinging light. In that case, the front main surface is that surface adapted for receiving the largest fraction of the impinging light.

The layer of hydrogenated SiN functions as a passivating layer in that it releases hydrogen (during a subsequent high-temperature step) and induces the charges that allow for a good surface passivation of the dielectric/substrate interface.

The dielectric layer on the rear surface may comprise depositing a low quality oxide. The low quality oxide may comprise low quality amorphous oxide, e.g. amorphous silicon oxide, which can reduce production costs when compared to production of high quality oxide. The low-quality amorphous oxide may be any of APCVD pyrolithic oxide, spin-on oxide, spray-on oxide or dip oxide. In embodiments of the present invention, the dielectric layer may be a deposited dielectric layer. Deposited dielectric layers are typically of lower quality than grown dielectric layers.

A low-quality dielectric layer, e.g. amorphous oxide, can for instance be a Spin-on oxide or APCVD (atmospheric pressure chemical vapor deposition) pyrolithic oxide (pyrox), spin-on, spray-on or dip oxide. It can be for instance a silicon oxide, TiO2 (e.g. deposited by solgel), or Al2O3/TiO2 pseudobinary alloys (PBAs).

Depositing the dielectric layer or wide bandgap semiconductor layer at certain temperatures may bring certain advantageous effects, some of which are described below. In embodiments of the present invention, the deposition temperature may be lower than about 600° C., hereby allowing processing without thermal poisoning of substrates. In embodiments of the present invention, the dielectric may be deposited e.g. by PECVD at a temperature below about 500° C. In embodiments of the present invention, the deposition temperature may be lower than about 410° C., which can be achieved by using for instance pyrox (having a typical deposition temperature of about 404° C.). In embodiments of the present invention the dielectric or wide bandgap semiconductor layer may be deposited by low temperature PEVCD (<about 300° C.). In other embodiments of the present invention, the deposition may be done at room temperature e.g. by spin-on, spray-on, dip or any other deposition from liquid, sol, solgel. The resulting dielectric layer or wide bandgap semiconductor layer may need further curing at higher temperatures, which can happen during further cell processing.

In some of the embodiments of the present invention, if a silicon substrate is used, any kind of silicon substrate may be used. Some examples of silicon substrates are Czochralski Si (cz-Si) wafers, Float-Zone Si (fz-Si) wafers, multicrystalline Si (mc-Si) wafers and Ribbon Si wafers. Some examples of layers are polycrystalline silicon layers which can be put on glass or glass-ceramic, or monocrystalline Si layers obtained by a lift-off process In some of the embodiments of the present invention, the thickness of the dielectric layer or wide bandgap semiconductor layer or sub-stack of dielectric layers and/or wide bandgap semiconductor layers may be approximately between 100 nm and 5000 nm, preferably between 100 nm and 4000 nm, more preferred between 100 nm and 3000 nm, still more preferred between 100 nm and 2000 nm, still more preferred between 100 nm and 1500 nm, still more preferred between 150 nm and 1200 nm, more preferably between 200 nm and 1200 nm, still more preferably between 600 nm and 1200 nm or between 800 nm and 1200 nm. Alternatively, the thickness of the dielectric layer or wide bandgap semiconductor layer or dielectric layer stack may be between about 400 nm and 800 nm. In some embodiments of the present invention, the minimal thickness of the dielectric layer or wide bandgap semiconductor layer or dielectric layer stack depends on the material which is employed and is determined by the amount of material which is necessary to act simultaneously as a diffusion mask during emitter diffusion, while still being of use for surface passivation and contact formation. For pyrox Silicon Oxide this is typically about 300 nm, for Al2O3/TiO2 pseudobinary alloys (PBAs) deposited by solgel this is about 150 nm. Those thickness values are only indicative and a deviation of about 10%, 20% or more from the given values is possible. Also a combination, or a stack of layers, of different materials are possible and would lead to a pre-determined threshold thickness for the combined diffusion mask, surface passivation and contact formation process.

It is one of the functions of the dielectric layers or wide bandgap semiconductor layers applied at the rear surface of a photovoltaic device, for instance a solar cell, in accordance with one embodiment, to increase the distance between the back contact material and the substrate surface. It has been found, surprisingly, that, for a distance between about 100 nm and 5000 nm, the larger the distance between the contacting layer at the rear surface of the photovoltaic device, for instance solar cell, and the rear surface of the substrate, the better the achieved passivation results, even with low quality dielectric materials or wide bandgap semiconductor layers being applied. It is an advantage of some embodiments of the present invention that sufficient passivation results may be achieved while using low-quality dielectrics. In addition, a thicker oxide deposited in the vias is expected to create a better isolation between the emitter electrode and the base of the semiconductor layer in the via and in the busbar region on the rear. Deposition of such low-quality dielectric layers may be performed by low-cost deposition techniques which may be fast.

In some embodiments, forming back contacts may comprise forming holes in the dielectric layer or wide bandgap semiconductor layer and the passivation layer or in the dielectric layer stack possibly provided with a passivation layer, and depositing a layer of contacting material onto the passivation layer or onto the dielectric layer stack, hereby filing the holes.

Forming holes may be performed by applying an etching paste, by mechanical scribing or by laser ablation for example.

In some embodiments of the present invention, depositing a layer of contacting material may be performed by evaporation, sputtering or screen printing, inkjet printing, stencil printing. Metals can be used as contacting materials, although advantageously Aluminum can be used. Some embodiments involve using Aluminum paste, allowing the formation of local BSF (back surface field) contacts. Alternatively, after depositing the passivation layer and firing it, one could deposit, instead of a metal, a p+ (or n+ on n-type substrates) semiconductor (like a-Si) by e.g. PECVD and then deposit a metal on top of it.

In some embodiments of the present invention, the layer of contacting material may be discontinuous. During the step of depositing the layer of contacting material, the contacting material may be deposited essentially in the holes. Different ways of depositing such a discontinuous layer of contact material exist, and are known by a person of ordinary skill.

In some embodiments the layer of contacting material may be initially discontinuous. This means that different areas can be covered with contacting material, whereby those different areas are not electrically connected to each other. These areas can be electrically connected later on in order to allow an optimal current flow through the device and/or an external load.

In some embodiments of the present invention, the layer of contacting material may be deposited in such way that light can also enter the device from the rear side, thereby allowing the production of bifacial solar cells.

In some embodiments of the present invention, a high temperature step may be applied to the layer of contacting material, i.e. a step at a temperature between about 600 and 1000 degrees Celsius, such as for example firing of the front and rear contacts in a rapid thermal process (tens of seconds). In general it is not essential that the method according to certain embodiments be used with the high temperature step, but the dielectric layer or wide bandgap semiconductor layer or dielectric layer stack can be resistant to such a high temperature step, which is typical in all industrial solar cells. In addition, during the high temperature step, for instance in a particular embodiment when using a SiNx:H/dielectric stack, the surface passivation of the dielectric/silicon interface can be improved. This high temperature step may e.g. be a contact firing step which may be performed at a temperature higher than about 730 degrees Celsius and below about 960 degrees Celsius, for maximum about a few tens of seconds. The firing step can be "co-firing" when the front and rear side contact are created at the same time. When this is decoupled, the rear side can be fired above 800 degrees Celsius, and subsequently the front contact can be fired around about 750 degrees Celsius (and possibly followed by a forming gas anneal—FGA—) The numbers in the last paragraph are indicative and certain variations are possible (e.g. of about 25%).

In some embodiments of the present invention, forming back contacts may be performed by applying a continuous layer of contacting material, e.g. metal, and applying local firing of the layer of contacting material, i.e. local heating e.g. by means of a laser. In this case, the continuous layer of contacting material can also serve as a back mirror.

In other embodiments of the present invention, forming back contacts may be performed by applying a patterned metal layer at the passivated rear surface of the photovoltaic device, for instance solar cell, and applying a general heating step.

Some embodiments of methods may further comprise a step of diffusion and emitter removal on the surface to be passivated (i.e. rear surface) before depositing the dielectric layer or wide bandgap semiconductor layer or the dielectric layer stack. However, if the dielectric layer or wide bandgap semiconductor layer or the dielectric layer stack is suitable for being used as a diffusion mask, these layers may be applied before the formation of the emitter takes place. In this case, no dopants will enter into the substrate at the rear surface of the device, and thus it is advantageous that according to some embodiments of the present invention emitter removal on the surface to be passivated may be avoided.

In a method according to embodiments of the present invention, for instance according to the first embodiment of the first aspect of the present invention, a step of diffusion may be applied after the step of depositing a dielectric layer or wide bandgap semiconductor layer and before the step of depositing a passivation layer.

In the same embodiment, the dielectric layer or wide bandgap semiconductor layer may be used as a diffusion mask. In advantageous embodiments of the present invention, the dielectric layer or wide bandgap semiconductor layer can be used simultaneously as a diffusion mask and for the purpose of surface passivation, thereby simplifying the cell process sequence. The dielectric layer or a wide bandgap semiconductor layer can be used as a diffusion mask, whether it is patterned or not. Normally it will not be patterned, and it is just a mask on the full rear surface. It may, however, be patterned e.g. for interdigitated or back contacted solar cells. Later on, the dielectric layer or wide bandgap semiconductor layer, whether patterned or not, may be locally removed, ablated, etched or patterned in order to create openings for local contacts to the substrate surface.

In some embodiments of the present invention, when it is not possible to use the passivation layer as a diffusion mask, a further step can be comprised of diffusion with another mask to be etched off, or maskless diffusion with subsequent rear side parasitic emitter removal before depositing the dielectric layer or wide bandgap semiconductor layer.

In some embodiments of the present invention, the front surface may have undergone a typical solar cell front surface processing. A typical solar cell front surface process may comprise texturing of the front surface, diffusion of phosphorus atoms at the front side, etching of the phosphorus glass and the deposition of a silicon nitride layer on the front side. Alternatively, the method steps as recited hereinabove for the rear surface may also be applied to the front main surface of the solar cell.

In some embodiments of the present invention, the substrate, e.g. silicon substrate, may be an ultra-thin substrate, which is typically thinner than about 250 micron, preferably thinner than about 200 micron, or more preferably thinner than about 150 micron. Reducing the thickness of the substrate allows a more efficient use of prime material, hence a lower cost. However, ultra-thin substrates may bow under or after certain treatments. Some embodiments of the present invention can improve the resistance against bowing of such ultra-thin substrates, therefore reducing at least some of the difficulties of the use of ultra-thin substrates for photovoltaic device, for instance solar cell, fabrication.

In one embodiment of the present invention, a thick SiN layer is deposited on a rear surface of a silicon substrate. The SiN layer has a thickness larger than about 100 nm, preferably a thickness of at least about 180 nm. When formed into a solar cell, such structure shows increased cell efficiencies for higher dielectric thicknesses. Furthermore, the cell efficiencies for dielectric layers thicker than about 100 nm have been found to be better than prior art cell efficiencies with lower dielectric thicknesses.

FIGS. 1, 2

FIG. 1 shows stages in a manufacturing process according to an embodiment, without showing the via. For instance more than about 100 nm, 200 nm, 800 nm of dielectric 1, e.g. oxide, are deposited on the substrate surface 4, e.g. silicon surface. On top of the dielectric 1, a layer of SiNx:H 3 optimized for hydrogen release is deposited. The substrate surface passivation is improved by means of hydrogenation.

Figure 2:
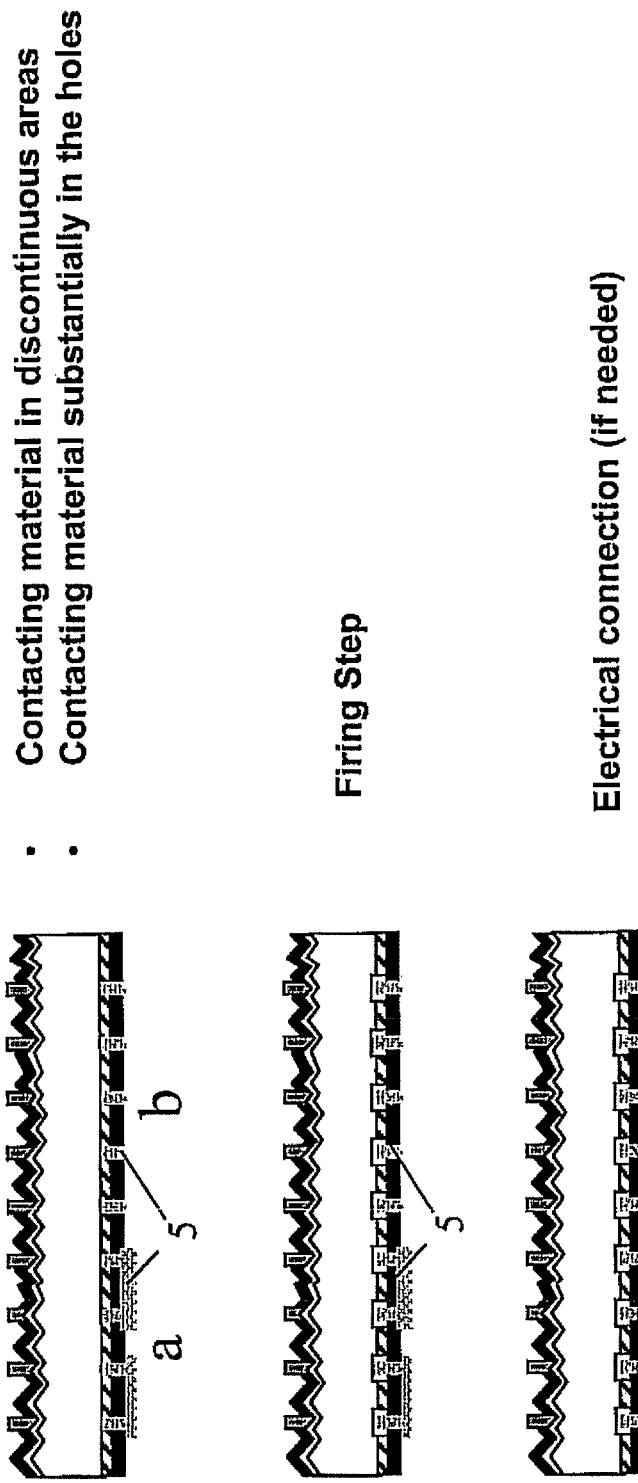
FIG. 2. shows an Illustration of stages in other fabrication processes according to another embodiment of the present invention.

The dielectric layer stack 1, 3 thus formed is then opened up by forming holes 6 in the stack, to form local contact areas. A layer of contacting material 5 is applied onto the dielectric layer stack 1, 3, hereby filling the holes. This may be done by screen printing, for example by simultaneously or consecutively front and rear side screen printing. A high temperature step such as co-firing is then applied in order to make contact with the substrate 2. The contacting material 5 may be applied as a continuous layer, or as a discontinuous layer as in FIG. 2. This means that different areas can be covered with contacting material 5, whereby those different areas are not electrically connected to each other. These areas can be electrically connected later on by electrical connection means 8 in order to allow an optimal current flow through the device and/or an external load.

A rear side passivation layer has thus been developed that (a) retains or improves its surface passivation qualities during the firing step, that (b) cannot be fired through by commercial Aluminum screen printed paste, while there exists a least-damage, fast technique to locally remove such layer prior to metallization, and that (c) does not interact with the capping metal layer during the firing process or when local contacts are otherwise formed through it.

Due to its characteristics this process
provides an efficient surface passivation, where
it is possible to make local (BSF) contacts, and
the process eliminates the bowing problems when using
ultra-thin wafers or substrates (e.g. problems when combined with Al screen printed paste on ultra-thin wafers).

A generic low quality amorphous oxide was deposited (e.g. $SiO_2$, SiOx, SOG, $TiO_2$, $Al_2O_3$ . . . or their pseudo-alloys, SiONx,) on the solar cell's rear side silicon surface (e.g. by APCVD, or spin coating). The surface passivation properties of the dielectric layer were improved by depositing an optimized hydrogenated dielectric layer (namely: SiNx:H). Such stacks retain the passivation properties during short high temperature treatments. The passivation properties are even improved during this treatment. This feature is important as it enables the use of the contact co-firing process that takes place in most of the industrial silicon solar cells' process sequence. Moreover, given that a) it is resistant to firing; i.e. it doesn't lose its relevant characteristics, b) it cannot be fired through, but c) it is possible to create local openings or holes in it by techniques such as e.g. etching paste or laser ablation, it enables for an easy way to create local back surface field (LBSF) contacts by selective alloying, during the firing process itself. The alloying process partially recovers any surface damage that may have incurred during the opening of the layer, thereby further simplifying the process. During the alloying, part of the Si surface and subsurface forms an alloy with the metal. The surface termination is therefore not crucial, as it would be e.g. when depositing another semiconductor, or a dielectric. A back surface field is formed and the effect of residual subsurface damage will be reduced, to a certain extent.

In an example, illustrated in FIG. 1, silicon oxide 1 was deposited by atmospheric pressure chemical vapor deposition (APCVD) onto a silicon substrate 2. As opposed to conventional thermal oxides, or wet oxides, which are known to be excellent for surface passivation of silicon, APCVD oxide has poor passivation properties and finds its application in microelectronics as an inexpensive and convenient diffusion mask, or dopant source. In fact, it can be deposited at about 400° C., which means that even low quality silicon material can withstand the deposition process without risk of thermal poisoning.

Thermal annealing can, to some extent, improve the surface passivation quality of APCVD oxide. However, prolonged treatments lead to a degradation of the sample.

Moreover, it has been observed that there may be a degradation of the surface passivation qualities with air exposure.

Hydrogenated silicon nitride (SiNx:H) 3 can be used to stably improve the quality of the oxide/silicon interface 4. It is known that silicon nitride can lead to excellent surface and bulk passivation properties on silicon, reason for which it is widely used in solar cell technology. However, its application for rear side passivation of an industrial solar cell is not straightforward. There exists an interaction between silicon nitride and metal capping layer (i.e. the rear surface contact of the solar cell), that leads to decreased surface passivation and cell efficiency (it is believed that this interaction is more than a "shunt" effect as described e.g. in Dauwe S., Mittelstädt L., Metz A., Hezel R., "Experimental evidence of parasitic shunting in silicon nitride rear surface passivated solar cells", Prog. Photovolt. Res. Appl., 10 (4), 271-278, (2002), which is incorporated herein by reference). Also the nitride recipes which are known to be best at surface passivation cannot withstand high temperature treatments such as the one that takes place during co-firing of the contacts. On the other hand, it is known that hydrogenated silicon nitride can release hydrogen during high temperature annealing treatments.

It is believed that the silicon nitride is used as a hydrogen source for the low quality oxide underneath, thereby significantly improving its surface passivation properties. The oxide layer in one experiment was about 800 nm thick, excluding any field-induced passivation effect from the overlying silicon nitride, which is in the prior art believed to be the reason for the good passivation quality.

Right after the deposition, the surface passivation quality of the oxide is very poor. After nitride deposition on top of the oxide layer there is a limited improvement (path A) and finally when firing the samples, an excellent surface passivation is achieved. Thermal cycles, like e.g. the ones that takes place with POC13 diffusion, lead to a limited surface passivation improvement like the one observed after nitride deposition, before firing. Nitride deposition on top of the oxide and firing, once again, lead to excellent surface passivation (path B). Firing with or without a metal layer on top leads to the same good results. It has been shown that firing alone (without the SiN layer deposition step first) is not beneficial. If firing is applied to the oxide layer alone, there is a degradation of its surface passivation properties. Nonetheless, these can be recovered by subsequent nitride deposition and firing (path C).

A further advantage of the technique is that since it can be applied to low quality oxides, it can be applied directly on diffusion mask oxides too, greatly simplifying the solar cell process.

Dielectric layer stacks with a dielectric layer with thickness between about 100 nm and 1500 nm have been deposited. When implemented in solar cells, the open circuit voltage has been measured as a function of the low quality dielectric thickness. Dielectric thicknesses between about 100 nm and 800 nm provide improved open circuit voltages with respect to the open circuit voltage of a cell obtained by a standard prior art process of full coverage aluminum BSF.

Other stacks than the above-mentioned silicon (substrate)/low quality oxide (dielectric layer)/silicon nitride (passivation layer) stack can for example be silicon (substrate)/dielectric or wide bandgap (>about 2 eV, preferably >about 3 eV) semiconductor, such as e.g. silicon carbide (SiC), aluminum nitride (AlN), gallium nitride (GaN) or boron nitride (BN)/silicon nitride
silicon (substrate)/silicon nitride/low quality oxide
silicon (substrate)/silicon nitride/wide bandgap (>about 2 eV, preferably >about 3 eV) semiconductor or dielectric
silicon (substrate)/Al$_2$O$_3$/ low quality oxide
silicon (substrate)/Al$_2$O$_3$/ wide bandgap (>about 2 eV, preferably >about 3 eV) semiconductor or dielectric In each of the above stacks, according to one embodiment, the dielectric layer stack has a thickness above about 100 nm.

Examples of Process Sequences

A typical process sequence for surface passivation including inside the vias can comprise:
Chemical cleaning
Low quality oxide deposition (about 100 to 1500 nm)
Silicon nitride deposition; for instance low frequency (about 450 kHz) direct PECVD Hydrogenated SiNx deposited at about 400 degrees from SiH4 and NH3 precursors
Firing in a three-zone belt furnace, at high belt speed (e.g. more than about 100 inch/min), peak set temperature of the furnace up to about 960° C.

This method for surface passivation can be integrated in the process sequence of a solar cell, in different situations:

A) Deposition After Diffusion
Opening of the vias, e.g. by laser drilling
Front side texturing
Diffusion, e.g. Phosphorus diffusion, resulting in doped, e.g. n-type doped, regions all around the substrate, i.e. both at the front surface and the rear surface
Glass removal, e.g. Phosphorus-glass removal,
Etching of Si at the rear (sufficient to remove n-type doped region at rear and in the vias)
Chemical cleaning
Low quality oxide deposition
Silicon nitride deposition (rear and possibly front)
Opening of the local contacts (e.g. by etching paste, scribing or laser ablation)
Forming the rear-contact bus bar (terminal electrode of the front contact grid connected to the front contact grid through the vias).
Forming the front contact grid.
Forming of base contacts (e.g. by metal deposition for local contacts on back surface (e.g. by evaporation, sputtering, screen printing)).
Firing in a commercial belt furnace B) Before Diffusion
Opening of the vias, e.g. by laser drilling
Chemical cleaning
Low quality oxide deposition on the back and in the vias
Diffusion (will only take place at the front surface to form the emitter, as at the rear surface low-quality oxide has been deposited and functions as a mask for the diffusion)
Silicon nitride deposition (rear and possibly front side)
Opening of the local contacts (e.g. by etching paste, scribing or laser ablation)
Forming the rear-contact bus bar (terminal electrode of the front contact grid connected to the front contact grid through the vias).
Forming the front contact grid.
Forming of base contacts (e.g. by metal deposition for local contacts on back surface (e.g. by evaporation, sputtering, screen printing)).
Firing in a commercial belt furnace Comparison to Other Techniques Compared to a standard metal wrap through (MWT) cell, at least some of the embodiments discussed show:
The Al-BSF layer and Al electrode is replaced by i-PERC dielectric stack and local back contact,
a passivating stack is deposited over the whole rear and inside the vias, and
there is no n+ diffusion layer in the vias Some additional specific advantages of some embodiments compared to the MWT cell are as follows:

Laser via drilling causes structural damage extending deep into the bulk. Not all of the damage is removed during chemical etching taking place directly after the laser drilling. Since the n+ layer is diffused in the damaged bulk in the vias, often high recombination currents are observed. In embodiments in which vias are covered by the dielectric stack before the diffusion step, there is no n+ layer on the rear side. Since laser damage layer is no longer near the junction region, its contribution to the recombination is minimal.

Another problem with the known MWT cell arises from metallization in the vias and on the rear side being printed directly on the "non-covered" n+ layer, rather than on top of the silicon nitride antireflection coating layer as happens on the front side. It is very difficult to find the right contact firing process so that the front metallization has low contact resistance and the metallization in the vias does not create shunts. If the firing temperature is too high, metal spiking creates significant shunts. This again reduces performance.

Finally, in the known MWT cell, the n+layer on the rear is in direct contact with the Al-BSF layer which results in shunting. Laser junction isolation is applied to separate n+ and p+ regions. Any imperfection in this step of junction isolation contributes to shunts. In the embodiments described, there is no n+ layer on the rear surface and both polarity electrodes are printed on dielectric so there is no need for any additional isolation. In the embodiments described, the constraints of alignment of the two polarity contacts are also relaxed since the metal printing by itself defines the contact isolation, and not an additional laser step, which has to be aligned to the gap between the 2 contacts in the MWT structure.

A possible difficulty or source of weakness occurs where the front-contact metal paste is very close to the base region of the substrate and separated from it by the oxide layer deposited in the vias (particularly at the intersection of the via and the front surface). Here there is some chance of the dielectric being a lot thinner than on the rear surface. In tests, the front side Ag paste did get through the SiNx layer during firing, and thus damage the Si. So there were grounds for predicting that it might get through the SiNx layer+a rather thin (but thickness extremely difficult to quantify) oxide layer at the front side edge of the via. In fact the iPERC stack optimized for base passivation proved to provide an unexpectedly efficient protection layer against the penetration of the Ag paste.

The new structure also proves to be better in terms of avoiding a loss in fill factor (FF) which occurs when the diffusion extends along the vias. Also, it is notable that the thick dielectric needed to protect the busbar region if you do not diffuse the vias, can also be used as the thick dielectric needed for the i-PERC process for the back side.

Compared to known MWT cells, there is different texturing, two additional dielectric depositions but laser isolating steps can be removed. Compared to i-PERC standard cells, there is the addition of the drilling of the vias, and one more metallization print step is used.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A photovoltaic device comprising:
   a semiconductor layer doped with a bulk dopant of a first type and having an emitter region doped with a dopant of a second type formed only at a front surface configured to receive impinging light, the semiconductor layer further having a rear surface opposite to the front surface;
   a front contact configured to collect current from the front surface;
   a rear bus bar formed at a rear side of the device and electrically connected to the front contact for collecting the current from the front surface through the front contact;
   a via formed through the semiconductor layer, such that an inside surface of the via is not doped with the dopant of the second type beyond the depth of the emitter region, the via having a conductive path formed therethrough and over the inner surface for coupling the front contact to the rear bus bar;
   a dielectric layer formed on the rear surface of the semiconductor layer and further on an inside surface of the via; and
   a back contact for the rear surface of the semiconductor layer, the back contact formed through a hole patterned through the dielectric layer,
   wherein the dielectric layer has a thickness between about 100 nm and 5000 nm to electrically insulate the conductive path from the inside surface of the via.

2. The device of claim 1, wherein the dielectric layer comprises a low quality oxide layer comprising any one of APCVD oxide, pyrolithic oxide, spin-on oxide, spray-on oxide, dip oxide, a silicon oxide, $TiO_2$, $TiO_2$ deposited by solgel, or $Al_2O_3/TiO_2$ pseudobinary alloys (PBAs).

3. The device of claim 2, wherein the device further comprises a back side passivation layer over the dielectric layer.

4. The device of claim 3, wherein the back side passivation layer extends at least part of the way into the via.

5. The device of claim 4, wherein the back side passivation layer comprises hydrogenated SiN.

6. The device of claim 1, wherein the dielectric layer extends over the rear surface around the via without being patterned and aligned to the via.

7. A method of manufacturing a photovoltaic device having a semiconductor layer doped with a bulk dopant of a first type and having a front surface for receiving impinging light and a rear surface opposite to the front surface, the method comprising:
   forming an emitter region doped with a dopant of a second type only at the front surface;
   forming a via through the semiconductor layer, the via being formed such that an inside surface of the via is not doped with the dopant of the second type beyond the depth of the emitter region;
   forming a dielectric layer on the rear surface of the semiconductor layer and on an inside surface of the via;
   forming a conductive path through the via for collecting current from the front surface, the dielectric layer having a thickness between about 100 nm and 5000 nm to electrically insulate the conductive path from the inside surface of the via;

forming a rear bus bar on the rear of the device to couple the conductive path through the via; and forming a back contact for the rear surface of the semiconductor layer, the back contact formed through a hole patterned through the dielectric layer.

8. The method of claim 7, wherein the diffusion region in the semiconductor layer is formed by diffusion from the front surface towards the rear surface, such that the semiconductor layer is doped with the dopant of the second type only to the depth of the emitter region in a vicinity of the via.

9. The method of claim 7, wherein forming the dielectric layer comprises depositing an oxide layer comprising any one of APCVD oxide, pyrolithic oxide, spin-on oxide, spray-on oxide, dip oxide, a silicon oxide, $TiO_2$, $TiO_2$ deposited by solgel, or $Al_2O_3/TiO_2$ pseudobinary alloys (PBAs).

10. The method of claim 9, further comprising forming a back side passivation layer over the dielectric layer.

11. The method of claim 10, wherein the back side passivation layer extends at least part of the way into the via.

12. The method of claim 7, wherein the dielectric layer is formed to extend over the rear surface around the via without being patterned and aligned to the via.

13. The method of claim 7, wherein the back contacts are formed by forming holes in the dielectric layer and the passivation layer, and filling the holes with electrically conductive contacting material.

14. The method of claim 7, further comprising firing the device to create the back contacts.

15. A photovoltaic device manufactured by the method of claim 7.

16. A photovoltaic device comprising:

a semiconductor layer doped with a bulk dopant of a first type and having an emitter region doped with a dopant of a second type formed only at a front surface configured to receive impinging light, the semiconductor layer further having a rear surface opposite to the front surface;

a via formed through the semiconductor layer, such that an inside surface of the via is not doped with the dopant of the second type beyond the depth of the emitter region, the via having a conductive path formed therethrough and over the inner surface for coupling a front contact to a rear bus bar, the front contact being configured to collect current on the front surface, the rear bus bar being formed on the rear surface; and a dielectric layer covering the rear surface of the semiconductor layer and further covering an inside surface of the via, the dielectric layer having a thickness between about 100 nm and 5000 nm such that the dielectric layer electrically insulates the inside surface of the via from the conductive path.

17. The device of claim 16, further comprising a back contact for the rear surface of the semiconductor layer, the back contact extending through the dielectric layer to the semiconductor layer.

18. The device of claim 16, wherein the dielectric layer extends over the rear surface around the via without being patterned and aligned to the via.

* * * * *